United States Patent
Oda et al.

(10) Patent No.: US 6,299,691 B1
(45) Date of Patent: Oct. 9, 2001

(54) METHOD OF AND APPARATUS FOR PROCESSING A SUBSTRATE UNDER A REDUCED PRESSURE

(75) Inventors: Hirohisa Oda; Yasushi Takehana, both of Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/488,791

(22) Filed: Jan. 21, 2000

(30) Foreign Application Priority Data

Jan. 28, 1999 (JP) .................................................. 11-019908

(51) Int. Cl.⁷ .................................................. C23C 16/00
(52) U.S. Cl. .................. 118/723; 118/715; 118/724; 118/725; 118/728; 134/6; 134/33
(58) Field of Search ............................... 438/795; 134/33, 134/6; 118/715, 723, 728, 725, 724

(56) References Cited

U.S. PATENT DOCUMENTS

| | | | |
|---|---|---|---|
| 5,034,086 | 7/1991 | Sato | 156/345 |
| 5,134,965 | 8/1992 | Tokuda et al. | 118/723 |
| 5,223,001 | 6/1993 | Saeki | 29/25.01 |
| 5,223,039 | 6/1993 | Suzuki | 118/723 |
| 5,242,539 | 9/1993 | Kumihashi et al. | 156/643 |
| 5,340,460 | 8/1994 | Kobayashi et al. | 204/298.09 |
| 5,359,177 | 10/1994 | Taki et al. | 219/121.43 |
| 5,421,056 * | 6/1995 | Tateyama et al. | 15/302 |
| 5,433,238 | 7/1995 | Cannizzaro et al. | 137/14 |
| 5,487,875 | 1/1996 | Suzuki | 422/186.05 |
| 5,517,085 | 5/1996 | Engemann et al. | 315/111.21 |
| 5,538,699 | 7/1996 | Suzuki | 422/186.29 |
| 5,556,473 | 9/1996 | Olson et al. | 118/719 |
| 5,803,975 | 9/1998 | Suzuki | 118/723 MW |
| 5,861,601 | 1/1999 | Sato et al. | 219/121.43 |
| 5,868,865 * | 2/1999 | Akimoto | 134/33 |
| 5,951,835 | 9/1999 | Namiki et al. | 204/298.24 |
| 5,964,954 * | 10/1999 | Matsukawa et al. | 134/6 |
| 5,981,399 | 11/1999 | Kawamura et al. | 438/715 |
| 5,981,913 * | 11/1999 | Kadomura et al. | 219/444.1 |
| 5,983,829 | 11/1999 | Suzuki | 118/723 MW |
| 5,985,091 | 11/1999 | Suzuki | 156/345 |
| 6,007,878 | 12/1999 | Takada et al. | 427/562 |
| 6,012,509 * | 1/2000 | Nonaka | 165/80.2 |
| 6,048,434 * | 4/2000 | Tamura et al. | 156/345 |
| 6,079,356 * | 6/2000 | Umotoy et al. | 118/723 E |
| 6,103,014 * | 8/2000 | Lei et al. | 118/715 |
| 6,120,661 * | 9/2000 | Hirano et al. | 204/298.15 |

FOREIGN PATENT DOCUMENTS

| | | |
|---|---|---|
| 43 11 360 | 10/1994 | (DE) . |
| 0 264 913 | 4/1988 | (EP) . |
| 0 564 359 | 10/1993 | (EP) . |
| 58-98916 | 6/1983 | (JP) . |
| 1-302719 | 12/1989 | (JP) . |
| 3-19332 | 1/1991 | (JP) . |
| 3-157585 | 7/1991 | (JP) . |
| 3-116413 | 12/1991 | (JP) . |
| 4-196313 | 7/1992 | (JP) . |
| 5-290995 | 11/1993 | (JP) . |
| 5-345982 | 12/1993 | (JP) . |
| 7-90591 | 4/1995 | (JP) . |
| 8-111297 | 4/1996 | (JP) . |
| 2722070 | 11/1997 | (JP) . |
| 2925535 | 5/1999 | (JP) . |
| 2942239 | 6/1999 | (JP) . |

* cited by examiner

Primary Examiner—Matthew Smith
Assistant Examiner—V. Yeusikov
(74) Attorney, Agent, or Firm—Fitzpatrick, Cella, Harper & Scinto

(57) ABSTRACT

A method of performing treatment under a reduced pressure for processing a substrate placed in a chamber, includes the steps of providing a heater within the chamber, for heating the substrate, placing the substrate on a susceptor, the substrate being placed above the heater within the chamber, chucking the substrate on the susceptor above the heater, heating the substrate with the heater, and evacuating the interior of the chamber to provide a reduced pressure environment.

16 Claims, 11 Drawing Sheets

METHOD OF AND APPARATUS FOR PROCESSING A SUBSTRATE UNDER A REDUCED PRESSURE

BACKGROUND OF THE INVENTION

1. Field of the Invention

The present invention relates to methods of and apparatus for processing substrates under a reduced pressure, for manufacturing semiconductor devices and the like. Such processing may include reduced-pressure chemical vapor deposition, thermal oxidation, plasma ashing, and plasma cleaning. More particularly, the present invention relates to a method of and apparatus for vacuum treatment suitable for treatment for ashing organic materials such as a photoresist and a residue thereof on a substrate.

2. Description of the Related Art

Hitherto, a known method of vacuum treatment generally comprises the steps of opening a vacuum chamber, loading a substrate on a susceptor in the open vacuum chamber, closing the vacuum chamber, evacuating the interior of the chamber after closing the chamber, heating the substrate, feeding processing gas into the chamber, opening the chamber after completing treatment, and removing the substrate.

A method of performing vacuum treatment for plasma ashing will be described in detail by way of example with reference to FIG. 17.

A substrate W, such as a silicon wafer, 200 mm in diameter and provided with a photoresist pattern, is loaded by its own weight on a susceptor 2 in a chamber 1, which is initially open. The chamber 1 is then closed and substrate W is then heated by heater 3 to a predetermined temperature.

Next, after evacuating the interior of chamber 1 by an evacuating means 6, processing gas, typically oxygen, is fed by a gas feeding means 7 into chamber 1, and a vacuum state therein is maintained.

Microwave energy from a microwave generator (not shown) provided at chamber 1 is fed into chamber 1 and microwave glow discharge occurs, whereby a plasma of the processing gas is generated. The photoresist pattern on substrate W can be stripped by ashing the photoresist pattern by generating ozone and evacuating chamber 1.

After a predetermined treatment time elapses or by monitoring plasma radiation, microwave emission and feed of processing gas are terminated when ashing of the photoresist is complete.

After evacuating the interior of chamber 1 to a predetermined pressure for removing residual processing gas, the pressure in chamber 1 is released to an ambient pressure by ventilation of the interior of chamber 1. Then, chamber 1 is opened and substrate W, on which the photoresist was stripped, is removed.

In the vacuum treatment apparatus described above, a problem arises when larger wafers, such as a 300 mm diameter wafer (so-called "12-inch wafers"), are processed. This problem, however, was not recognized when 200 mm diameter wafers (so-called "8-inch wafers") were processed. The problem is the generation of non-uniform ashing, that is, non-uniform ashing rates.

This fact was discovered by repeated intensive experiments by the inventors of the present invention and is as follows. Warping of the substrate, which occurs when the substrate is loaded on the susceptor, is generated due to a non-uniform temperature profile caused by non-uniform contact between the upper surface of the susceptor and the substrate. In addition, a longer period of time than expected is required for the warping to disappear and for temperatures over the entire substrate to become uniform. Consequently, when treatment throughput is of a high priority, ashing generally must start before a uniform temperature profile on the substrate is obtained, so that non-uniform ashing occurs.

In other words, it is recognized that a rapid and uniform temperature rise of the entire substrate to a predetermined temperature is an important factor for improving throughput and for performing reliable treatment. Moreover, the above factor not only applies to an ashing apparatus, but also broadly applies to vacuum treatment apparatuses described above, such as those for chemical vapor deposition (CVD), which perform treatment under a vacuum.

SUMMARY OF THE INVENTION

Accordingly, it is an object of the present invention to provide a treatment method which achieves a high throughput and high reliability, and an apparatus therefor.

It is another object of the present invention to provide a treatment method which is able to rapidly and uniformly raise temperatures over an entire substrate to a predetermined temperature, and an apparatus therefor.

It is another object of the present invention to provide a treatment method which is able to suppress non-uniform treatment, and an apparatus therefor.

To these ends, the present invention provides a treatment method and an apparatus therefor, for processing substrates under a reduced pressure, having the following features.

In one aspect, the present invention provides a method of performing treatment under a reduced pressure for processing a substrate placed in a chamber, the method comprising the steps of providing a heater, within the chamber, to heat the substrate, placing the substrate on a susceptor, the substrate being placed above the heater, within the chamber, chucking the substrate on the susceptor above the heater, heating the substrate with the heater, and evacuating the interior of the chamber to provide a reduced environment.

According to another aspect, the present invention provides a treatment apparatus for processing a substrate under a reduced pressure, the substrate being placed in a chamber, the apparatus comprising a heater for heating the substrate, and a susceptor, located within the chamber, the susceptor comprising chucking means for chucking the substrate above the heater. In this aspect of the present invention, the heater may be located within the chamber, and the susceptor may be located above the heater, within the chamber.

According to still another aspect, the present invention provides an apparatus for processing a substrate under a reduced pressure, the substrate being placed in a chamber, the apparatus comprising heater for heating the substrate, a chucking means for chucking the substrate above the heater, an evacuating means for evacuating the interior of the chamber, to provide a reduced pressure environment, and a controller for controlling the heater, the chucking means, and the evacuating means. In this aspect of the present invention, as well, the heater may be located within the chamber, and the susceptor may be located above the heater, within the chamber.

Further objects, features and advantages of the present invention will become apparent from the following description of the preferred embodiments with reference to the attached drawings.

DESCRIPTION OF THE PREFERRED EMBODIMENTS

Figure 1:
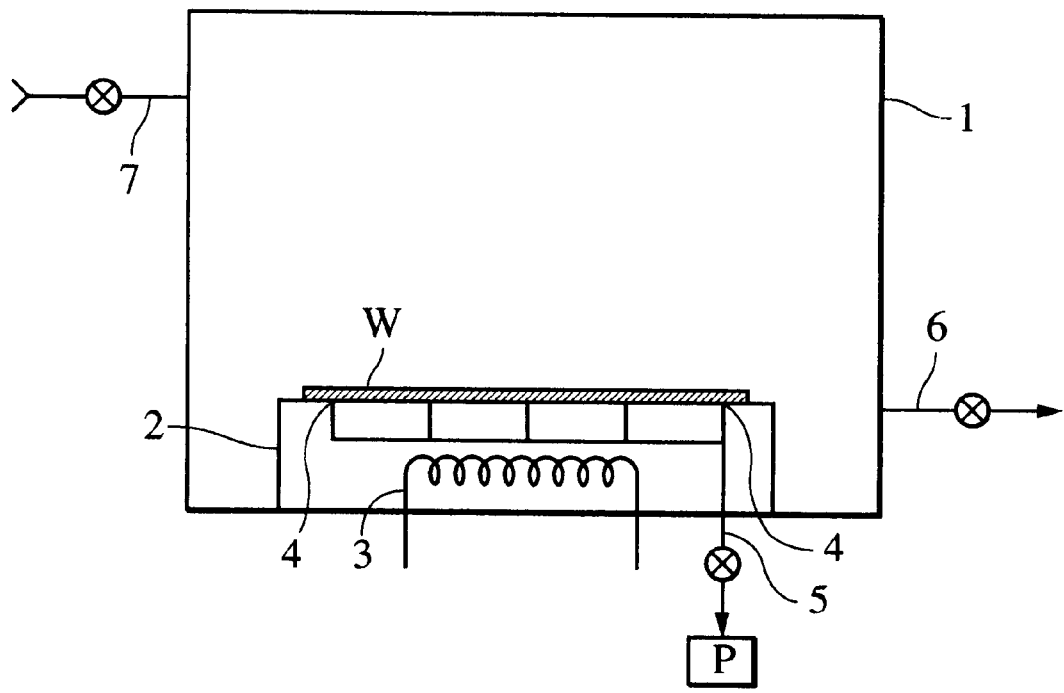
FIG. 1 is a schematic diagram showing a vacuum treatment apparatus according to the present invention.

FIG. 1 shows a basic treatment apparatus according to the present invention. Typically, the treatment apparatus is operated under a reduced pressure, which may be a vacuum.

In this embodiment, the apparatus is a vacuum treatment apparatus having a vacuum chamber 1 that can be evacuated for processing a substrate W disposed therein under a vacuum. The apparatus comprises a heater 3 for heating substrate W. The apparatus also comprises a susceptor 2 provided with suction apertures 4 and a suction passage 5. The pressure of suction apertures 4 and suction passage 5 is reduced by using pump P or an equivalent device. The apertures 4, suction passage 5 and pump P comprise chucking means for placing and chucking substrate W above heater 3.

Numeral 6 represents an evacuating means for evacuating the interior of chamber 1, which is arranged by optionally combining vacuum pumps, conduits, valves, and the like. Numeral 7 represents a gas feeding means for feeding processing gas, which is arranged by optionally combining conduits, valves, mass flow controllers, gas cylinders, and the like.

A procedure for performing vacuum treatment by using the apparatus will be explained with reference to FIG. 2. In Step S1, heater 3 is activated so that susceptor 2 itself is heated. In Step S2, substrate W is placed on the heated susceptor 2 above the heater 3 in the process chamber 1. Chucking of the substrate W to the susceptor 2 is performed by the chucking means (4, 5, and P), with the pressure inside suction aperture 4 being reduced to be less than that of the ambient pressure outside chamber 1. Thus, due to a difference in the pressure of suction aperture 4 from that of chamber 1, substrate W is chucked on the heated susceptor 2 above heater 3. In Step S3, the interior of chamber 1 is evacuated by evacuating means 6.

Then, processing gas is fed into chamber 1 by the gas feeding means 7, so that a desired reduced pressure or vacuum treatment, such as ashing, CVD, heat treatment, and cleaning, is performed on substrate W. The vacuum treatment is performed under a working pressure of less than 1 atmospheric pressure. In fact, a working pressure of less than $1.33 \times 10^-$Pa is preferable.

According to the embodiment of the present invention described above, heating and chucking of the substrate are performed approximately at the same time, so that the entire rear surface of substrate W. which closely contacts the susceptor 2, is uniformly and efficiently heated.

Consequently, the entire substrate W is rapidly heated so as to reach a predetermined temperature and to be maintained at that temperature.

In the description above, susceptor 2 and heater 3 are discussed separately. However, since heat is conducted to substrate W through the thermal conductive susceptor 2, susceptor 2 may be considered to be a heat source for substrate W. That is, susceptor 2 may be considered to be a heater, as well.

Figure 3:
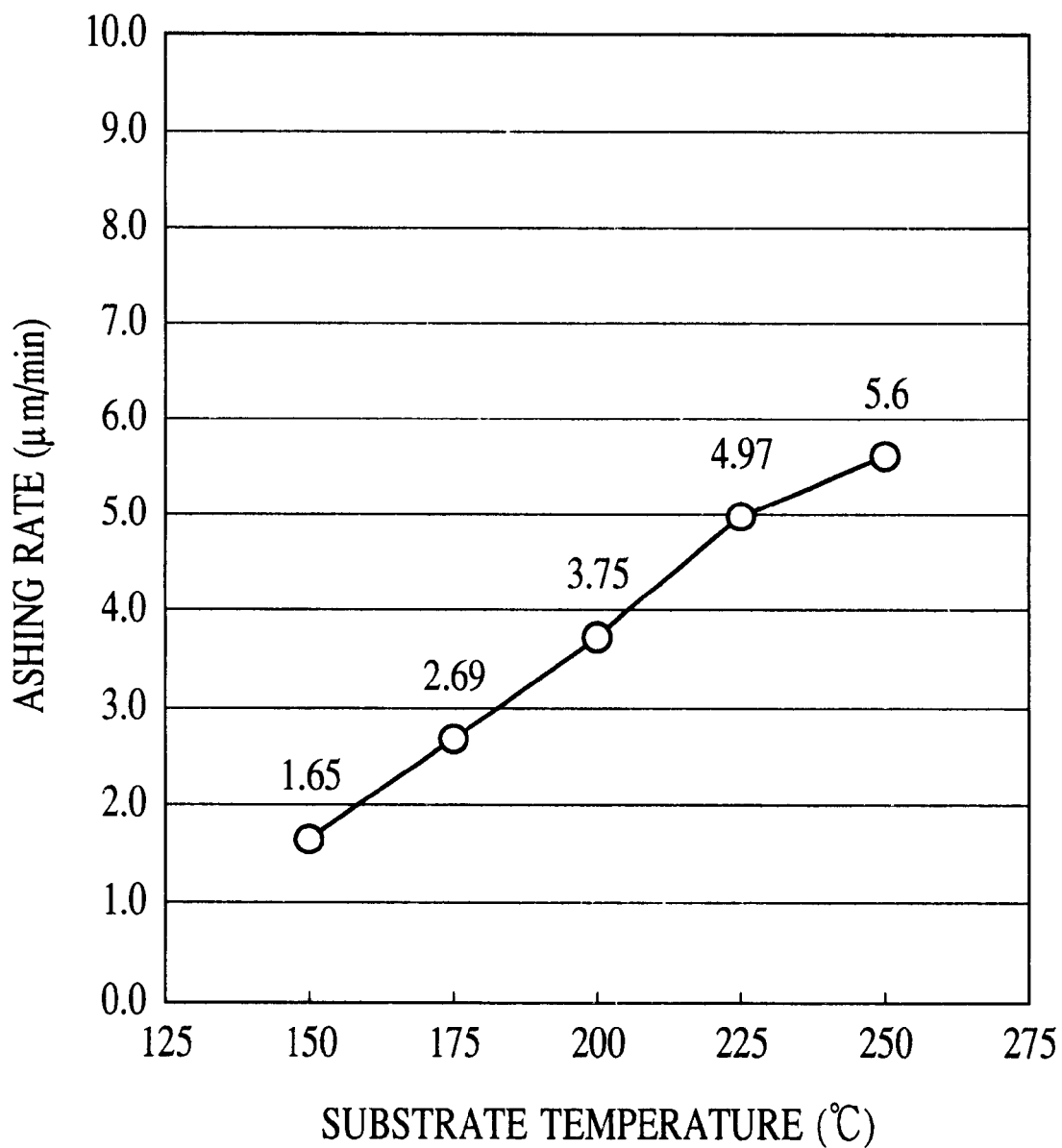
FIG. 3 shows a change in ashing rate versus a change in temperature of a substrate.
Figure 4:
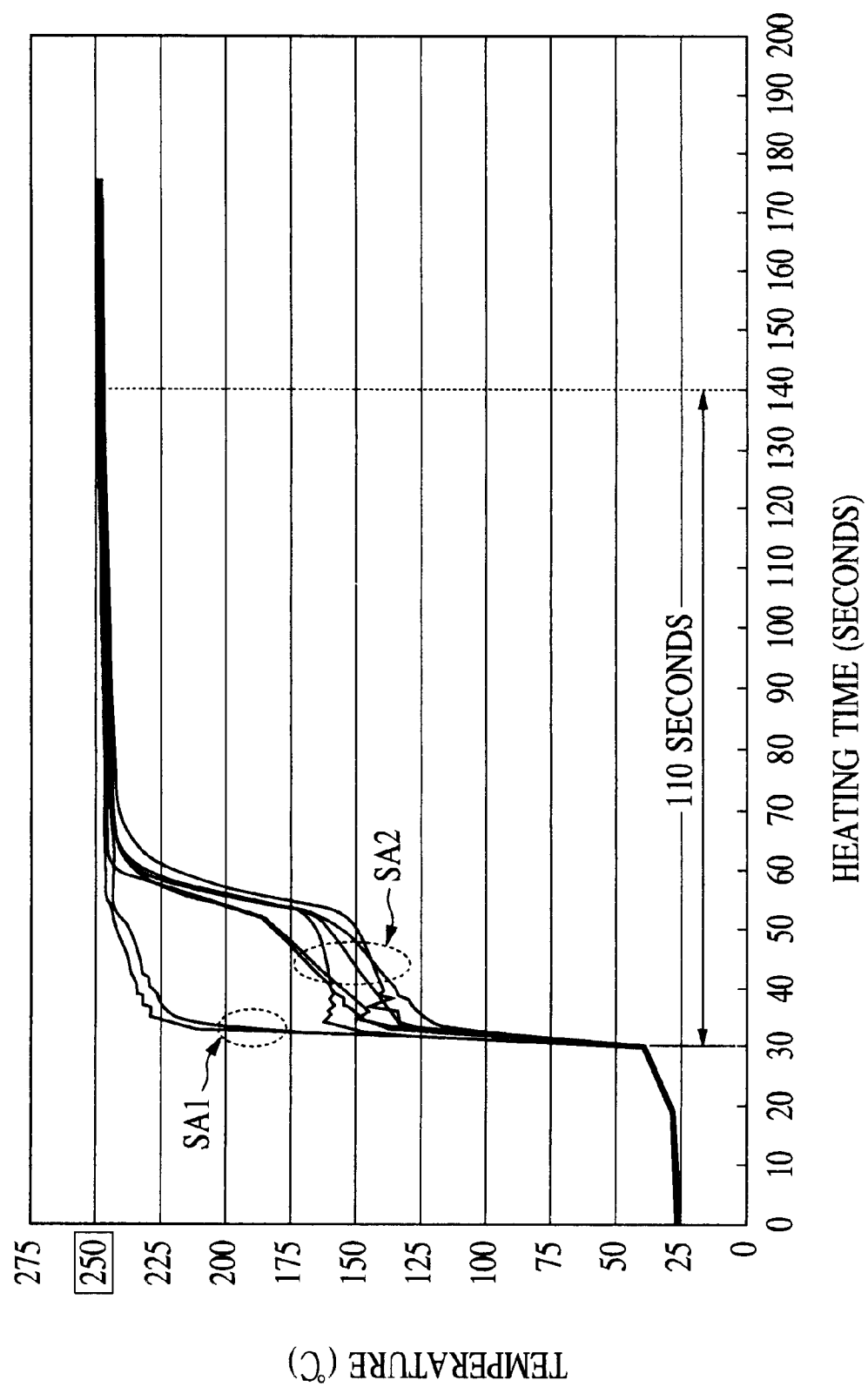
FIG. 4 shows characteristics of temperature rise in a substrate loaded by its own weight when warping is generated under ambient pressure.
Figure 5:
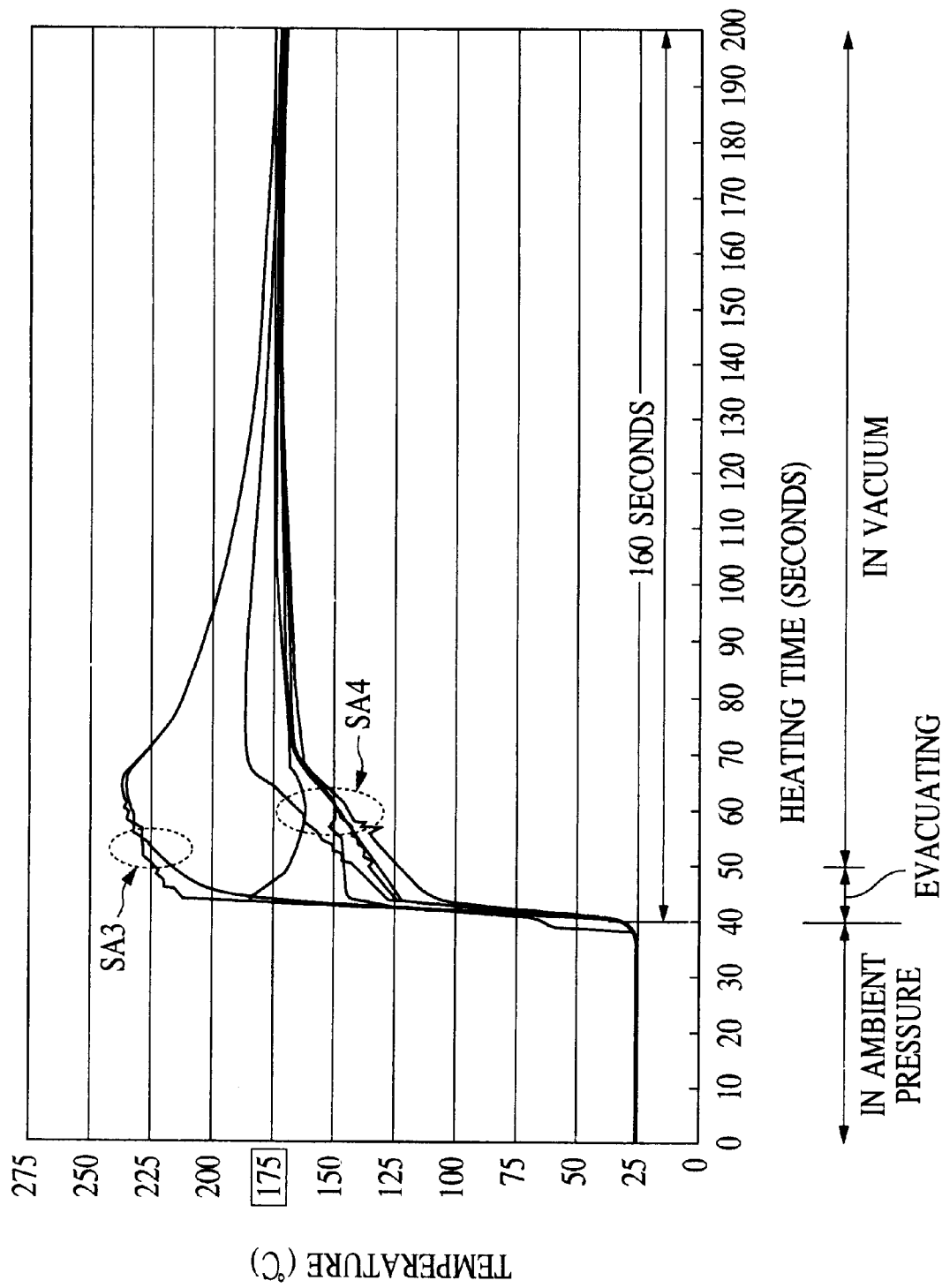
FIG. 5 shows characteristics of temperature rise in the substrate loaded by its own weight when warping is generated under reduced pressure.

Referring to FIGS. 3 to 5, the relationship between the chucking operation for the substrate and the improvement of uniformity of treatment will be explained by using an example of ashing.

Concomitantly with an increase in the size of a substrate, pedestals (susceptors) for receiving substrates and heaters in vacuum chambers of ashing apparatuses must be made larger. However, an increase in heater size inevitably deteriorates the uniformity of the in-plane temperatures. The use of a heater of superior specifications is one way to solve the problem mentioned above. This, however, will result in an increase in the cost of the apparatus. One of the factors reducing the uniformity in an ashing treatment is a deterioration of the in-plane uniformity of temperature in the substrate.

FIG. 3 is a graph specifically showing the relationship between the ashing rate per minute of a photosensitive resin (hereinafter referred to as "ashing rate") and the temperature of the substrate to be processed. According to this graph, the ashing rate per degree Celsius is 0.05 $\mu$m/min/° C. The currently required uniformity of the in-plane ashing rate is said to be ±5%. To obtain an in-plane uniformity of ashing rate of ±5%, the in-plane uniformity of substrate temperatures must be ±5° C. when the ashing rate is supposed to be 5 $\mu$m/min/° C.

In a conventional ashing apparatus, a means for chucking the wafer is not employed and the substrate is loaded by its own weight, probably because of the need for a separate vacuum apparatus. An increase in the substrate size generally means an increase in the diameter of the substrate, whereas the thickness of an 8-inch wafer is not so different from that of a 12-inch wafer. Consequently, with an increase in the diameter of a wafer, internal stresses in the wafer are more apt to appear as warping than in the past. If the in-plane temperature deviation of a substrate is large when the substrate is placed on a heated plate, even a substrate with no photosensitive resin coating may warp, or warping previously generated may increase. If warping is generated under ambient pressure, by thermal convection from a heater adjacent to the substrate and by thermal conduction therein, the warped substrate readily returns to a flat form within a short period of time and the temperature thereof reaches that of the susceptor.

FIG. 4 shows the relationship between the temperature change at the surface of the substrate and the elapsed time when warping of the substrate on the susceptor is observed thirty seconds after loading the substrate by its own weight on the susceptor, at ambient atmospheric pressure. From this graph, it is confirmed that a warping in the substrate is generated within several seconds after loading the substrate on the susceptor, and that rates of temperature rises differ between a region (SA 1) where the substrate contacts the susceptor and a region (SA 2) where the substrate does not contact the susceptor, due to the warping. The substrate returns to a flat form approximately seventy seconds later by thermal convection from the heater adjacent to the substrate and by thermal conduction within the substrate, and approximately one hundred forty seconds later, the temperature of the substrate reaches that of the susceptor. When the warping is generated in the substrate, the temperature rise proceeds as described above. As a result, more than one hundred ten seconds are required for the temperature of the substrate to reach that of the susceptor and for the in-plane temperature uniformity of the substrate to become within ±5° C. This is not practical.

Next, when a warping in the substrate is generated under a vacuum, only thermal conduction within the substrate and thermal radiation from the heater contribute to an improvement of the temperature profile within the substrate. Hence, a longer period of time is necessary for obtaining a uniform temperature profile for the substrate to return to a flat form. In addition, since substantial thermal convection from the heater cannot be anticipated because of the vacuum conditions, the temperature of the substrate becomes uniform primarily by thermal conduction within the substrate with heat accumulated therein under ambient atmospheric pressure.

FIG. 5 shows the relationship between the temperature change at the surface of the substrate versus the elapsed time, specifically when the warping of the substrate on the susceptor is observed forty seconds after loading the substrate by its own weight on the susceptor under a vacuum. From this graph, it is confirmed that a warping in the substrate is generated within several seconds after loading the substrate on the susceptor, and that rates of temperature rises differ between a region (SA 3) where the substrate contacts the susceptor and a region (SA 4) where the substrate does not contact the susceptor, due to the warping. In a vacuum, in which thermal convection from the heater adjacent to the substrate cannot be anticipated, the substrate is recovered to a flat form approximately two hundred seconds later due to the temperature profile within the substrate becoming uniform by thermal conduction therein, and the temperature of the substrate does not reach that of the susceptor (250° C.). Rather, the temperature of the substrate remains at approximately 175° C. When the temperature rise proceeds as described above and warping is generated in the substrate, more than one hundred sixty seconds are required for the in-plane temperature uniformity of the substrate to become within ±5° C., and the temperature of the substrate ultimately does not reach the actual temperature of the susceptor.

Consequently, in a situation in which warping is generated, it is difficult to ensure efficient treatment within a shorter period of time, which is required for an apparatus. In addition, a decrease in productivity may become an issue.

Figure 2:
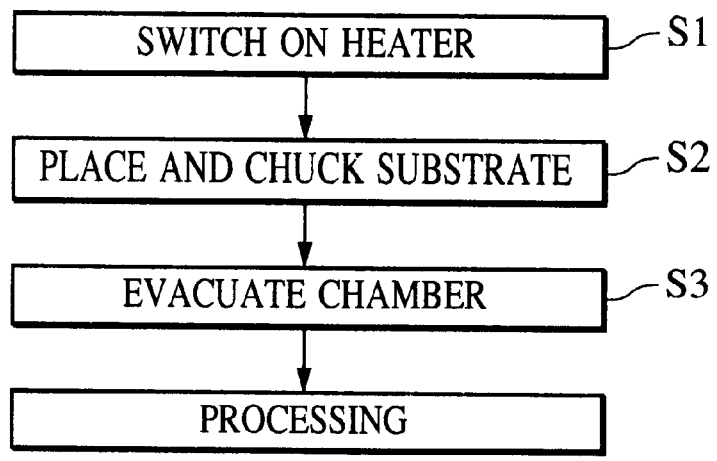
FIG. 2 is a flow chart of a method of vacuum treatment according to the present invention.

When the processes shown in FIG. 2 are performed by using the apparatus shown in FIG. 1. the substrate W is contacted with the heated susceptor 2 by vacuum chucking, so that the entire surface of the substrate W shows the temperature rise characteristics of region SA 1 shown in FIG. 4.

Accordingly, since ashing rates at any position within the substrate are equivalent, stable and uniform treatment can be performed.

The following loading method, which includes using a means for moving the substrate up and down, is preferable for improving process throughput. When heater 3 is operated, substrate W is placed so as to be distant and above susceptor 2 disposed on heater 3, which is capable of chucking the substrate W under a vacuum. The substrate W is then lowered and chucked under a vacuum by the susceptor 2.

In addition, suction passage 5, leading to suction apertures 4, preferably communicate with chamber 1 so that suction apertures 4 communicate with the interior of chamber 1 via the thus formed communicating passage, before evacuation is started. Thus, the substrate W is prevented from floating when chucking is released and from being contaminated at the backside thereof by any extraneous particles.

Furthermore, as discussed above, susceptor 2 and heater 3 may be separate members so as not to increase the manufacturing cost of the parts. When the upper surface of heater 3 is designed to be of a non-planar form to compensate for heat distortion of heater 3 and/or susceptor 2 caused by an operating temperature, contact between the susceptor 2 and the heater 3 is enhanced, and better uniform thermal conduction can be achieved.

An anisotropic thermal conductive sheet (not shown), such as a graphite sheet, is preferably provided between susceptor 2 and heater 3. which are separate members, to assist in providing uniform heating.

When a vacuum treatment apparatus of this embodiment of the present invention is used as a microwave plasma treatment apparatus, a method for generating plasma by radiating microwaves in a chamber of the apparatus from a microwave antenna of a conductive flat plate having a plurality of slots may be employed. Microwave antennas, such as radial line slot antennas (RLSA), which are disclosed in, for example, Japanese Patent Application Publication No. 2722070, U.S. Pat. No. 5,034,086, and Japanese Laid-Open Patent Application Publication No. 8-111297, and planar multi-slot antennas (PMA), disclosed in Japanese Patent Application Publication No. 2-925535 and Japanese Patent Application Publication No. 2-942239, which have a plurality of slots formed on a flat surface in an H-shape in an endless annular waveguide, are preferably employed.

Figure 6:
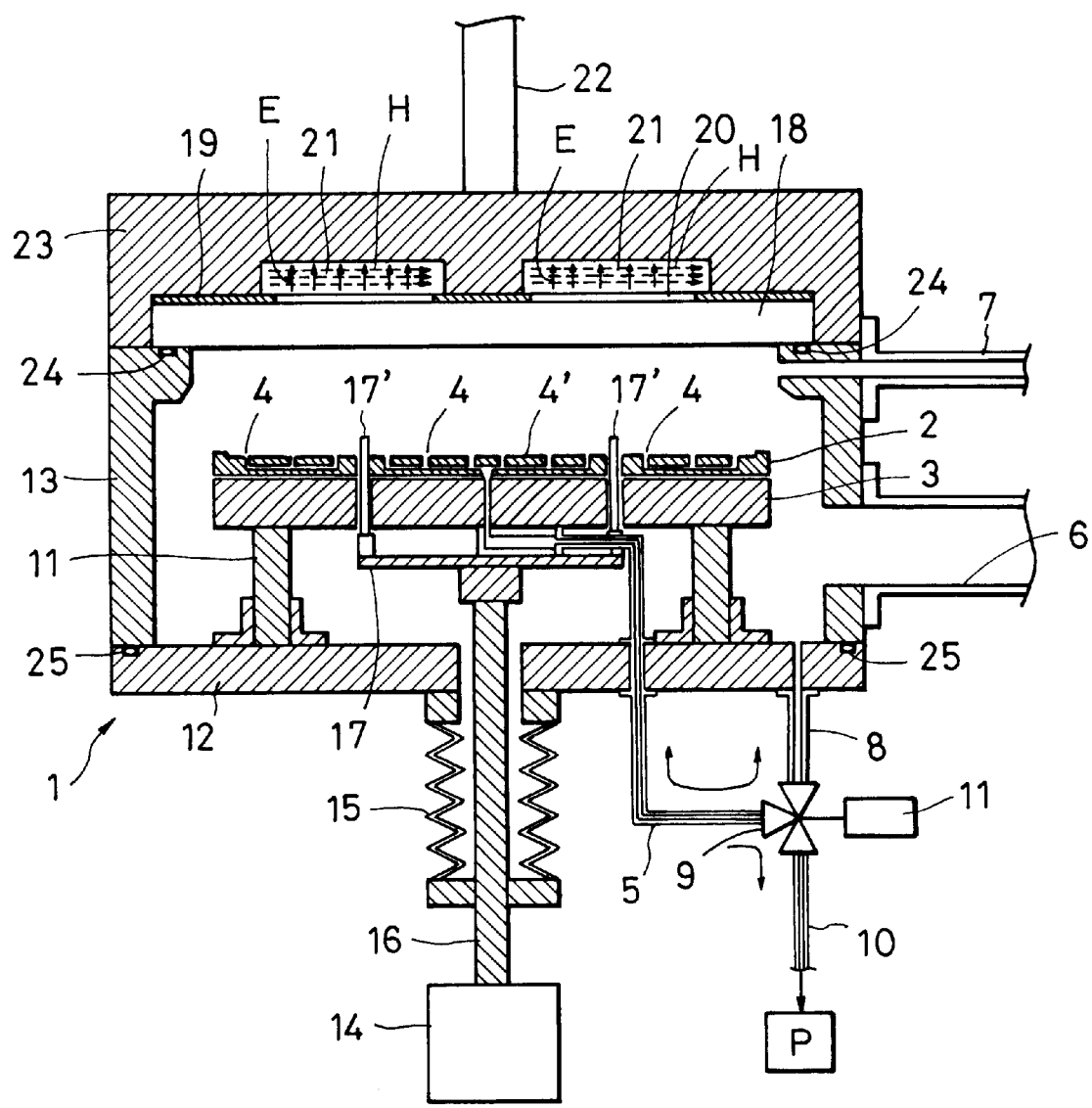
FIG. 6 is a schematic diagram showing a vacuum treatment apparatus for ashing according to the present invention.

FIG. 6 shows a vacuum treatment apparatus for microwave plasma ashing.

A chamber 1 that can be evacuated includes an upper chamber portion 13, a lower chamber portion 12 and a wall of a dielectric body 18, in which chamber 1 is designed to open when the upper chamber 13 and the lower chamber 12 respectively move up and down in opposite directions.

A number of suction apertures 4 are formed in a susceptor 2 (i.e., a loading pedestal), which communicate with a conduit formed to be a suction passage 5 via a suction path 4' formed in susceptor 2 and in heater 3. Thus, substrate W is chucked on the upper surface of susceptor 2 by a vacuum generated from a suction pipe 10 through a three-way valve 9.

One path of the three-way valve 9 communicates with chamber 1 via a conduit 8, so that a first state of communicating suction apertures 4 with the suction pipe 10, and a second state of communicating suction apertures 4 with chamber 1, can be selectively changed by a three-way valve controller 11.

The heater 3, which has a diameter approximately equivalent to that of susceptor 2, is supported by a supporting shaft 16 and is heated to raise the temperature thereof by electrifying a heating element (not shown) in heater 3.

For loading substrate W by its own weight on susceptor 2 and for removing substrate W from susceptor 2, there are provided lift pins 17', a supporter 17 for supporting lift pins 17', supporting shaft 16 for moving lift pins 17' up and down, and a driving source 14. In addition, a bellows 15 maintains chamber 1 airtight when lift pins 17' move up and down.

In this embodiment, a microwave generator is a PMA, which includes an antenna having a conductive flat plate 19 provided with a number of slots 20, a wall member 23 composed of a conductive material, and an endless annular waveguide path 21 formed therein. Microwaves are emitted by a magnetron (not shown) into the endless annular waveguide path 21 through a rectangular waveguide 22, for example, in a $TE_{10}$ mode and propagate in the rectangular waveguide path 21. $TE_{10}$ mode microwave in a rectangular waveguide is provided with electric field E and magnetic field H as shown FIG. 6. When the length of the waveguide 22 is designed to be a multiple integer of the rectangular wavelength of the microwaves, a standing wave can be generated. The microwaves are radiated from the slots 20 into chamber 1 through a dielectric plate 18.

Processing gas fed by a gas feeding means 7 is excited by the microwaves and glow discharge plasma thereof is generated under the dielectric plate 18.

Thus, ozone is generated, which causes ashing of organic materials, such as a photoresist, adhering on the substrate W, and is then evacuated with the ashes from the interior of chamber 1 by evacuating means 6.

Figure 7:
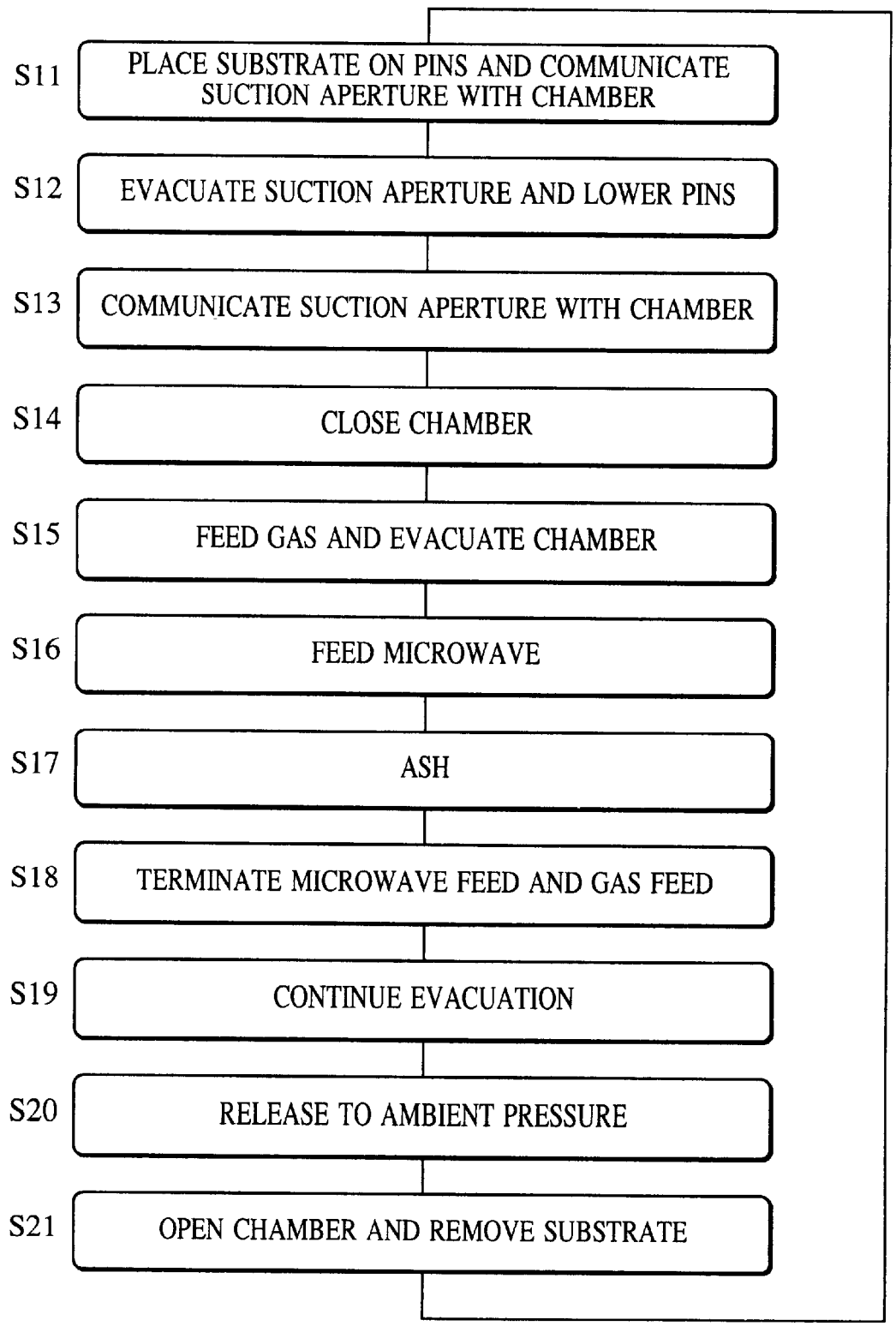
FIG. 7 is a flow chart showing steps of vacuum treatment for ashing according to the present invention.

FIG. 7 is a flow chart showing a method of vacuum treatment for microwave plasma ashing. With reference to FIG. 6, first, substrate W is loaded on the lift pins 17' by a transportation unit. At this stage, a function for chucking the substrate of the pedestal 2 does not operate and suction apertures 4 communicate with chamber 1 (Step S11).

When a process for chucking the substrate is in a prior predetermined treatment procedure, the function for chucking the substrate is actuated so that suction apertures 4 are evacuated by switching three-way valve 9 by the three-way valve controller 11. At the same time, substrate W placed on the lift pins 17' is lowered by movement of the driving source 14 for moving lift pins 17' up and down. When substrate W is placed on susceptor 2 so as to cover suction apertures 4, substrate W is chucked on susceptor 2 by the difference in pressure between the interior of chamber 1 and that of the suction apertures 4. At this step, a pressure sensor or the like of a control system (not shown in the Figures) provided at the pipe 10 monitors whether substrate W is securely chucked (Step S12).

After substrate W is chucked for a predetermined period of time, the function for chucking the substrate is released by switching the three-way valve 9 or the like (Step S13). The required treatment time for processing substrate W should be verified by testing beforehand. Suction apertures 4 communicate with chamber 1 again at this step. However, since the temperature at the entire surface of substrate W is equivalent to the treatment temperature and uniformity of the temperature of the substrate is obtained, no warping in the substrate is generated.

Chamber 1 is closed for vacuum treatment (Step S14), and the interior of chamber 1 is evacuated by evacuating means 6. Since the pressure of suction apertures 4 is maintained at a pressure equivalent to that of the interior of chamber 1 through pipe 8, substrate W is free of problems such as floating away from susceptor 2, and the contact between substrate W and susceptor 2 is maintained. Thus, the temperature uniformity on the surface of substrate W is also maintained. Under a condition of controlling pressure so as to maintain a prior predetermined pressure, processing gas is fed by gas feeding means 7 (Step S15). Microwaves to be used for treatment are emitted into chamber 1 through waveguide 22, waveguide path 21, and dielectric plate 18 (Step S16). By plasma excitation and ozone generated thereby, an ashing process of a photoresist on substrate W is performed (Step S17). Emission of the microwaves is terminated and the feed of the processing gas is also terminated (Step S18).

After completion of the ashing treatment, evacuation of residual gas is performed until the pressure reaches the base pressure, such as one Pa. Similar to the above, the pressure between substrate W and susceptor 2 also reaches the base pressure (Step S19).

When ventilation gas such as nitrogen is introduced into chamber 1 to release the pressure to an ambient pressure so that chamber 1 is ready to be opened, the pressure between substrate W and susceptor 2 is arranged to be equivalent to that in chamber 1 by the communication between pipe 8 and suction apertures 4 (Step S20).

Thus, the pressure below substrate W, while the substrate is being processed, is always adjusted according to that in chamber 1.

When the pressure in chamber 1 becomes approximately equivalent to that outside thereof, chamber 1 is opened and the processed substrate W is removed (Step S21).

The substrate W is lifted up to a sufficient height by lift pins 17' to be removed. (Prior to the movement of lift pins 17', a safe pressure for operation is confirmed by a control system (e.g., as to whether the three-way valve functioned correctly).)

Figure 8:
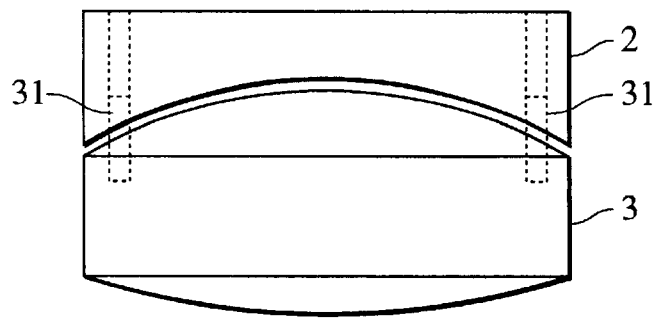
FIG. 8 is a schematic diagram of a substrate holder used in the present invention.

FIG. 8 shows another example of a susceptor for receiving the substrate according to the present invention.

In the example mentioned above, the bottom surface of a susceptor 2, which is typically made of SiC or aluminum, is machined to have a concave surface with a depth of 0.2 to 0.3 mm. Since heater 3 is a hollow structure, which is more readily distorted by heat than the susceptor 2, heater 3 has a flat shape at room temperature as shown by the flat lines in the Figure, and heater 3 is distorted at an elevated temperature, such as 250° C., to have a 0.2 to 0.3 mm convex form at the top and the bottom surfaces, respectively.

The susceptor 2 and heater 3 are removably engaged with each other by titanium or aluminum coated stainless steel screws 31 passing through holes provided in susceptor 2.

The heater 3 is sometimes thermally distorted to have concave forms at the top and the bottom surfaces depending on the structure thereof. In the above case, the contact with susceptor 2 can be compensated for by having a convex form at the bottom surface thereof. A method for mounting screws is not limited to the arrangement shown in FIG. 8.

It is preferable to improve the thermal conductance along the top surface of the heater 3 in the thickness direction by disposing an anisotropic thermal conductive elastic sheet (not shown), such as a graphite sheet, between heater 3 and susceptor 2.

In mass production, instead of performing the chucking process for every substrate, it may be determined whether vacuum chucking of the substrate is required in consideration of the presence or the degree of heat distortion based on the processes to which the substrate was previously subjected. In this case, it is more preferable that the treatment time or the like be designed to be changeable so as to shorten treatment by eliminating unnecessary waiting.

EXAMPLE 1

A silicon wafer twelve inches in diameter and a silicon wafer with the same diameter on which a photoresist was coated and exposed were prepared, and a process shown in FIG. 7 for ashing the photoresist by using an apparatus shown in FIG. 6 was performed.

Figure 9:
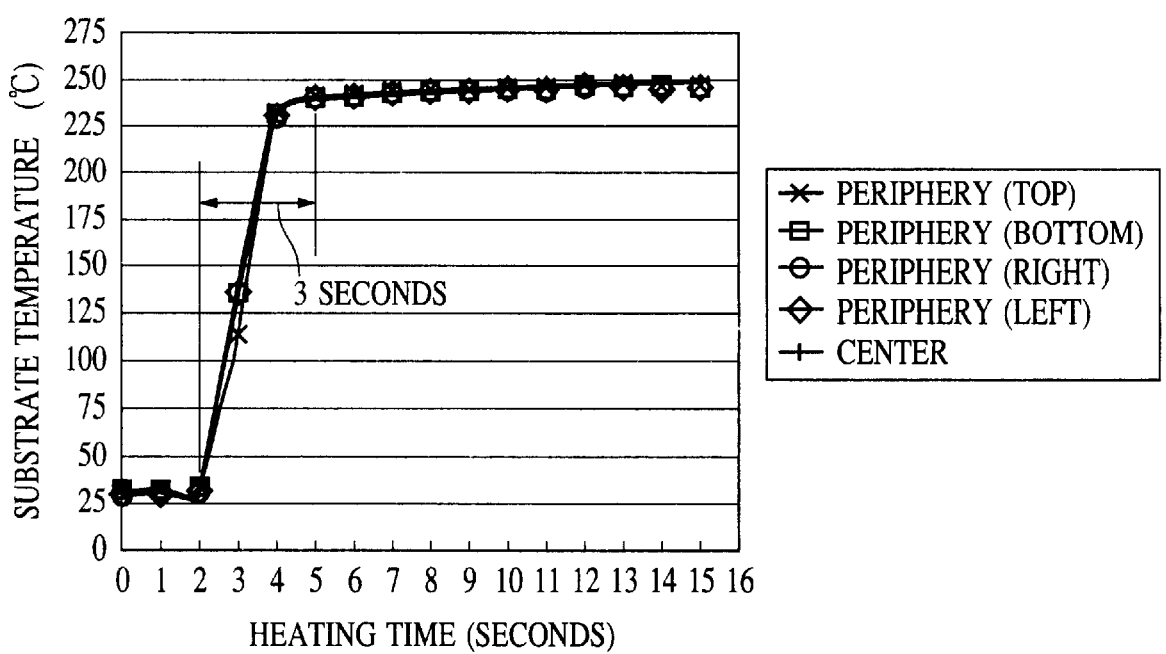
FIG. 9 shows characteristics of temperature rise in a substrate being chucked.

When the silicon wafer was chucked by a vacuum at a setting temperature of the heater of 250° C., the temperature of the silicon wafer rose from room temperature to 245° C. in approximately 3 seconds, as shown in FIG. 9.

The in-plane temperature profile of the silicon wafer was within ±5%.

Figure 10:
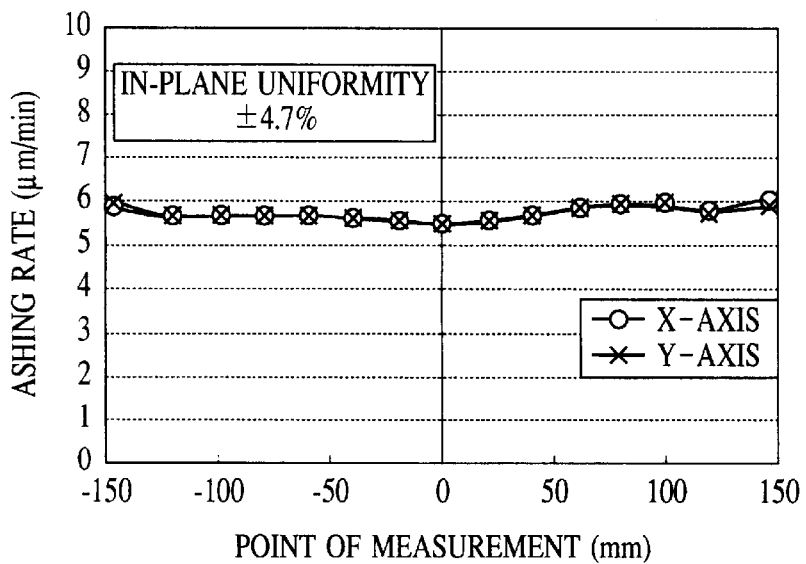
FIG. 10 shows ashing characteristics of a substrate being chucked.

Ashing of the photoresist provided on the silicon wafer was performed in a similar manner to that as described above. The in-plane profile of the ashing rates is shown in FIG. 10. The uniformity thereof was ±4.7%.

Comparative Example 1

Figure 11:
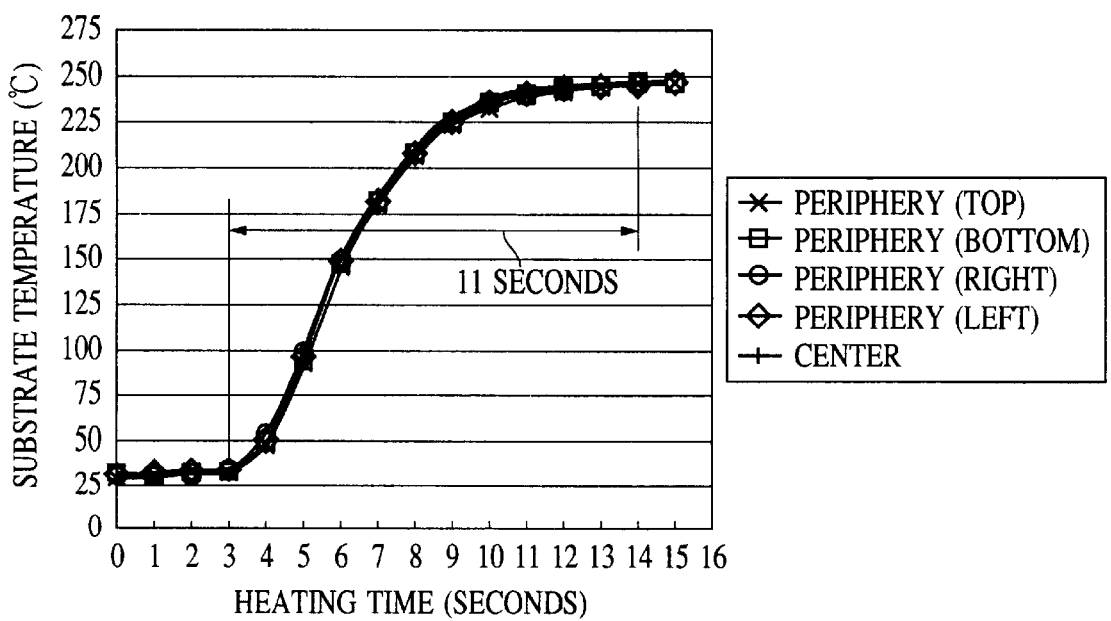
FIG. 11 shows characteristics of temperature rise in a substrate loaded by its own weight.

A silicon wafer twelve inches in diameter was prepared in a manner similar to that in Example 1 and was loaded by its own weight on a susceptor equipped in the apparatus shown in FIG. 6. Since vacuum chucking was not performed, it took eleven seconds for the temperature of the silicon wafer to reach 245° C. and for the in-plane profile of ashing rates to reach the ±5% range, as shown in FIG. 11.

Figure 12:
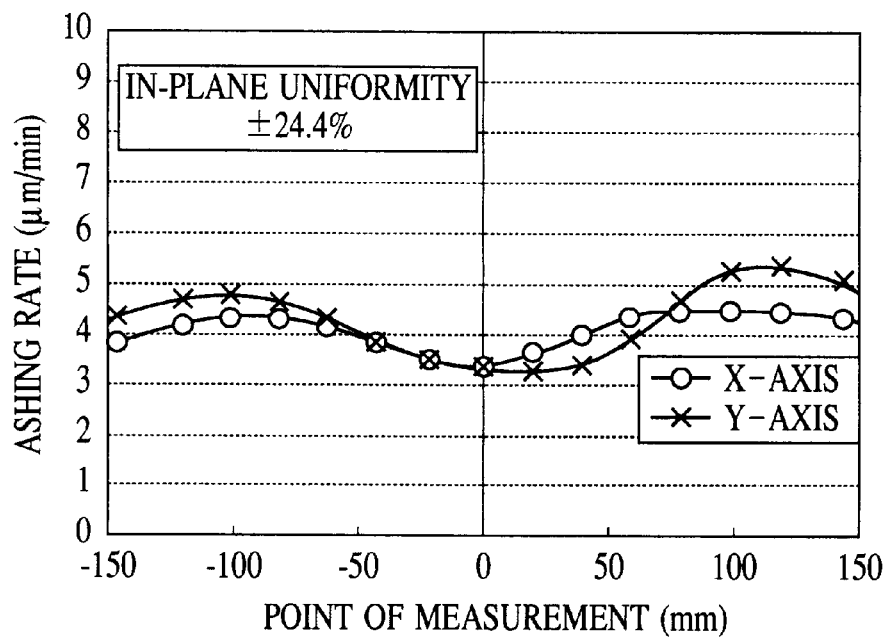
FIG. 12 shows ashing characteristics of a warped substrate loaded by its own weight.

When a silicon wafer provided with a photoresist was prepared in a manner similar to that in Example 1 and was loaded by its own weight on a susceptor, without vacuum chucking, the in-plane profile of ashing rates was ±24.4%, as shown in FIG. 12.

The mean value of the ashing rates in Comparative Example 1 was approximately two-thirds of that in Example 1.

EXAMPLE 2

A wafer holder having a susceptor and a heater with a graphite sheet therebetween, as shown in FIG. 8, was prepared.

Figure 13:
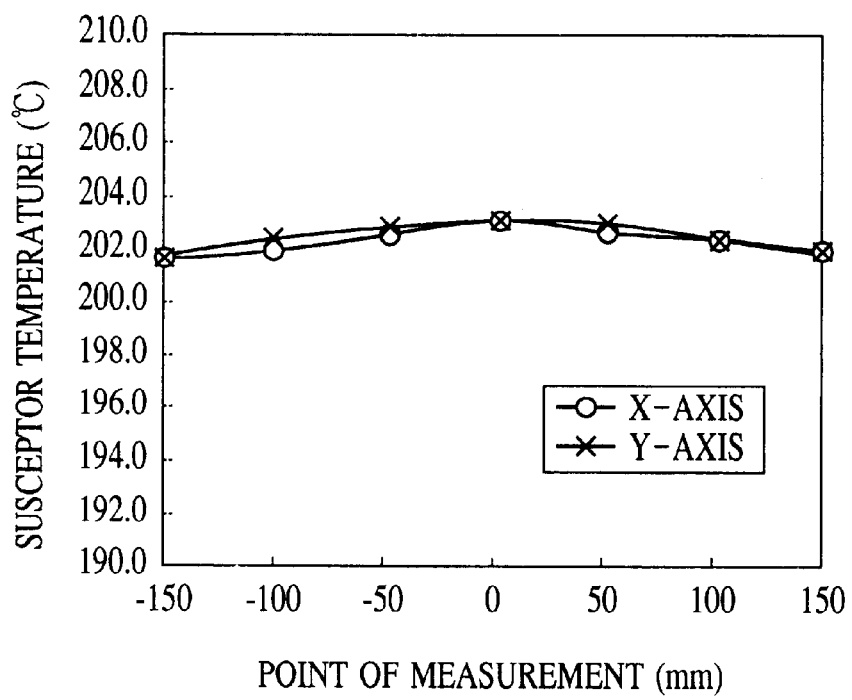
FIG. 13 shows a temperature profile of a susceptor with a graphite sheet.

The in-plane temperature profile on the upper surface of the susceptor is shown in FIG. 13. The difference between the maximum temperature and the minimum temperature, that is, the range of in-plane temperatures was 1.5° C.

Comparative Example 2

A susceptor with a non-concave face at its bottom surface, that is, with a flat surface at the bottom thereof, was heated without using a graphite sheet, by a heater that is to be distorted thermally.

Figure 14:
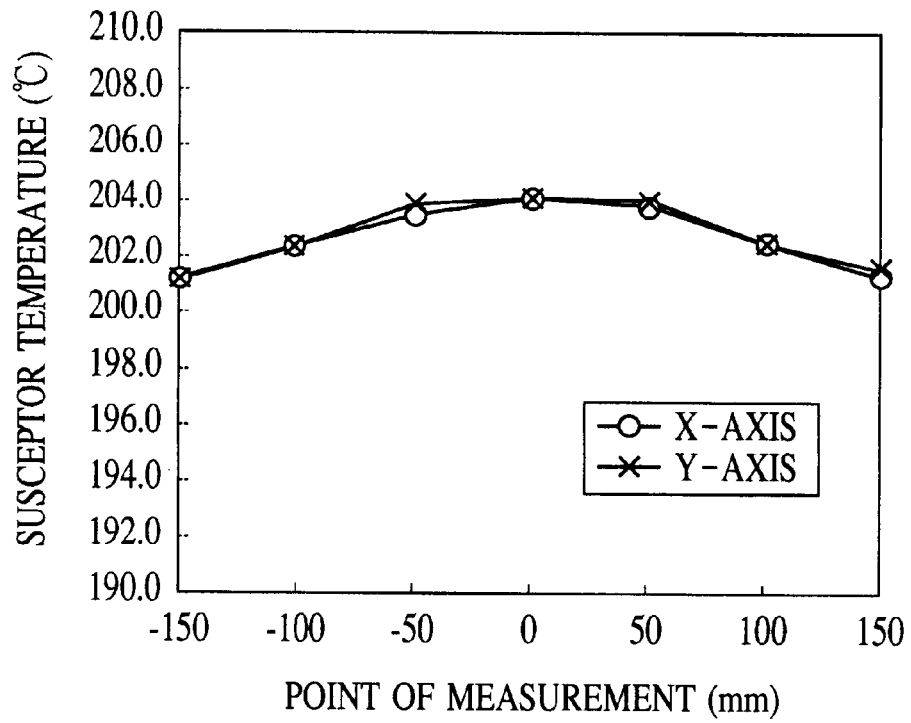
FIG. 14 shows a temperature profile of a susceptor without the graphite sheet.

The in-plane temperature profile at the upper surface of the susceptor is shown in FIG. 14, and the range of in-plane temperatures was 2.9° C.

EXAMPLE 3

A silicon wafer eight inches in diameter, on which a photoresist was coated and then exposed, was prepared.

An ashing apparatus having a susceptor and a heater as shown in FIG. 8, with a graphite sheet therebetween, was prepared.

Figure 15:
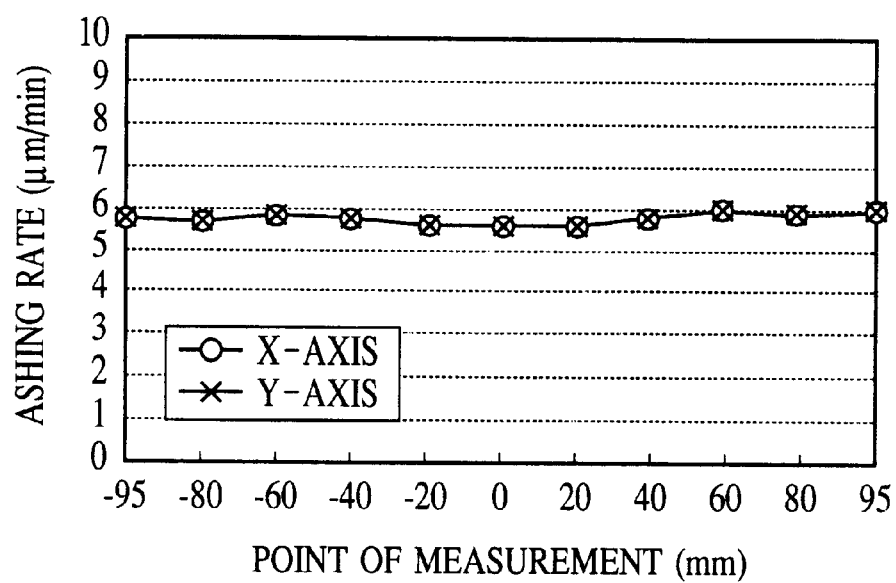
FIG. 15 shows ashing characteristics by using a graphite sheet heater with a machined concavity.

When the silicon wafer provided with a photoresist was chucked by a vacuum on the susceptor and ashing thereof was performed in the apparatus described above, the in-plane profile of ashing rates was obtained, as shown in FIG. 15. The ashing rates at measurement points on the silicon wafer were within ±3.4%.

EXAMPLE 4

A silicon wafer eight inches in diameter, on which a photoresist was coated and then exposed, was prepared.

A wafer holder, combining a heater to be distorted thermally and a susceptor having a flat surface at the bottom with nothing therebetween, was provided.

Figure 16:
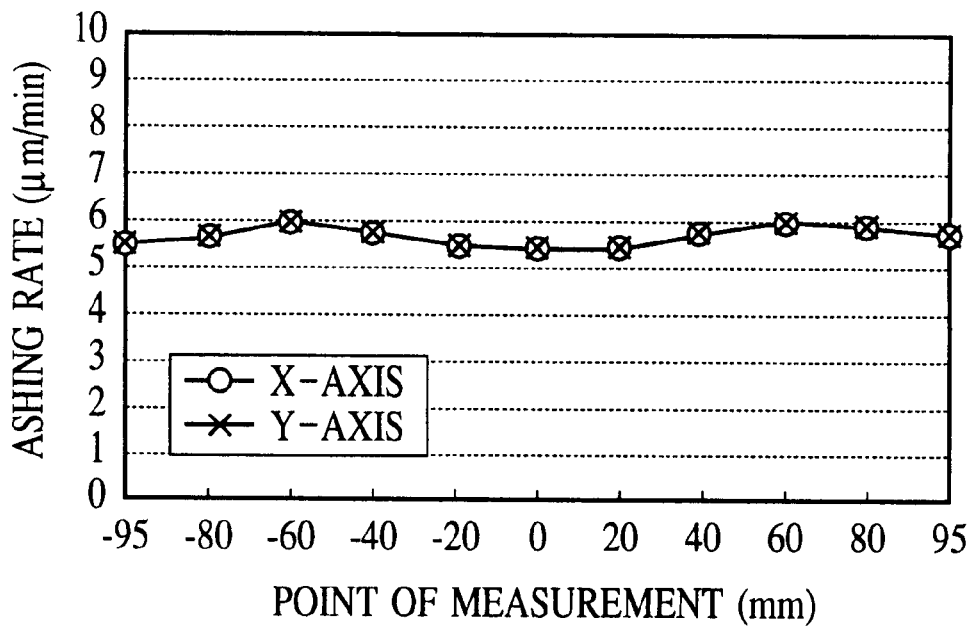
FIG. 16 shows ashing characteristics by using a graphite sheet heater without a machined concavity.
Figure 17:
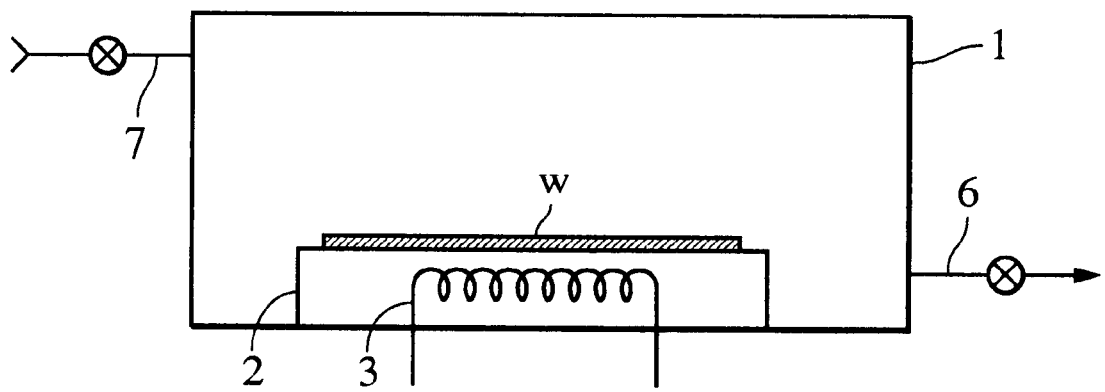
FIG. 17 shows a conventional vacuum treatment apparatus.

When the silicon wafer with a photoresist was chucked by a vacuum on the susceptor, heated up, and then ashing was performed, the in-plane profile of ashing rates was obtained, as shown in FIG. 16. The ashing rates at measurement points on the silicon wafer were within ±4.8%.

When the treatment according to the present invention is applied in a low-pressure chemical vapor deposition (CVD) process, formation of non-uniform thickness profiles will be suppressed. In addition, when applied to a thermal treatment apparatus, such as thermal oxidation treatment, formation of non-uniform processed surfaces will be reduced. Furthermore, the present invention can be applied to preheating apparatuses used for various treatment apparatuses.

According to the embodiments of the present invention described above, since the substrate is brought into contact closely with the heated susceptor in a very short period of time, distortion of the substrate can be suppressed and the substrate can uniformly and efficiently be heated from the bottom surface thereof. Thus, the temperature of the substrate reaches a predetermined temperature in a short period of time and is maintained, whereby non-uniform treatment, even at an elevated temperature, can be avoided. Thus, reliable, high throughput treatment can be performed.

Except as otherwise disclosed herein, the various components shown in outline or in block form in the figures are individually well known and their internal construction and operation are not critical either to the making or using of this invention or to a description of the best mode of the invention.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A treatment apparatus for processing a substrate under a reduced pressure, the substrate being placed in a chamber having a chamber evacuation path, said apparatus comprising:

a heater for heating the substrate;

a susceptor, located within the chamber, said susceptor comprising chucking means for chucking the substrate above said heater, said chucking means comprising a plurality of suction openings; and a control valve selectively providing a first state in which said plurality of suction openings of said chucking means are in communication with a vacuum path separate from the chamber evacuation path, and a second state in which said plurality of suction openings of said chucking means are in communication with an interior of the chamber.

2. A treatment apparatus according to claim 1, wherein said heater is located within the chamber.

3. A treatment apparatus according to claim 2, wherein said susceptor is located above said heater, within the chamber.

4. A treatment apparatus according to claim 1, further comprising a control valve controller for selecting between the first state and the second state.

5. A treatment apparatus according to claim 4, wherein said control valve controller causes said control valve to provide the second state after the substrate has been chucked for a predetermined time in the first state.

6. A treatment apparatus according to claim 1, wherein said susceptor and said heater are separate members, in which the upper surface of said heater is non-planar to compensate for heat distortion of at least one of said heater and said susceptor at an operating temperature.

7. A treatment apparatus according to claim 1, wherein said susceptor and said heater are separate members, said heater is composed at least in part of aluminum, and said heater and the substrate are engaged by a screw comprising one of titanium and aluminum coated stainless steel.

8. A treatment apparatus according to claim 1, wherein said susceptor and said heater are separate members, and further comprising an anisotropic thermal conductive sheet between said heater and the substrate.

9. A treatment apparatus for processing a substrate under a reduced pressure placed in a chamber, said apparatus comprising:
   a heater for heating the substrate;
   chucking means for chucking the substrate above said heater, said chucking means comprising a plurality of suction openings;
   evacuating means for evacuating the interior of the chamber, to provide a reduced pressure environment, said evacuating means having an evacuation path;
   a control valve; and
   control means for controlling said heater, said chucking means, said control valve, and said evacuating means, wherein said control means controls said control valve so as to provide a first state in which said plurality of suction openings of said chucking means are in communication with a vacuum path independent of said evacuation path, and a second state in which said plurality of suction openings of said chucking means are in communication with the interior of the chamber.

10. A treatment apparatus according to claim 9, wherein said heater is located within the chamber.

11. A treatment apparatus according to claim 10, wherein said chucking means is located above said heater, within the chamber.

12. A treatment apparatus according to claim 9, wherein said treatment apparatus further comprises an ashing unit for ashing the substrate.

13. A treatment apparatus according to claim 9, wherein said control means comprises means for (i) arranging the substrate so as to be distant and above said chucking means, and (ii) lowering the substrate onto said chucking means and chucking the substrate.

14. A treatment apparatus according to claim 13, further comprising a susceptor, which is comprised at least in part of said chucking means, wherein said control means further comprises means for (iii) causing said control valve to provide the second state after the substrate has been chucked for a predetermined time in the first state, and (iv) closing the chamber.

15. A treatment apparatus according to claim 14, wherein said control means further comprises means for (v) evacuating the interior of the chamber, (vi) feeding a processing gas into the chamber, (vii) generating a plasma of the processing gas, (viii) terminating the generation of the plasma and evacuating the interior of the chamber, (ix) releasing the interior of the chamber to an ambient pressure, and (x) opening the chamber and removing the substrate.

16. A treatment apparatus according to claim 9, further comprising a microwave antenna of a conductive plate, having a plurality of slots, which radiates microwaves in the chamber and generates a plasma therein.

* * * * *

UNITED STATES PATENT AND TRADEMARK OFFICE
CERTIFICATE OF CORRECTION

PATENT NO. : 6,299,691 B1
DATED : October 9, 2001
INVENTOR(S) : Hirohisa Oda et al.

Page 1 of 1

It is certified that error appears in the above-identified patent and that said Letters Patent is hereby corrected as shown below:

Column 2,
Line 51, "heater" should read -- a heater --.

Column 4,
Line 16, "$1.33 \times$ Pa" should read -- $1.33 \times 10^3$ Pa --.
Line 20, "substrate W." should read -- substrate W, --.

Column 6,
Line 4, "FIG. 1." should read -- FIG. 1, --.
Line 36, "heater 3." should read -- heater 3, --.

Signed and Sealed this

Second Day of April, 2002

Attest:

JAMES E. ROGAN
*Attesting Officer*   *Director of the United States Patent and Trademark Office*